(12) United States Patent
Matsunami

(10) Patent No.: US 11,011,225 B2
(45) Date of Patent: May 18, 2021

(54) SEMICONDUCTOR STORAGE DEVICE

(71) Applicant: TOSHIBA MEMORY CORPORATION, Tokyo (JP)

(72) Inventor: Junya Matsunami, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/560,584

(22) Filed: Sep. 4, 2019

(65) Prior Publication Data
US 2020/0286552 A1 Sep. 10, 2020

(30) Foreign Application Priority Data

Mar. 6, 2019 (JP) .............................. JP2019-040269

(51) Int. Cl.
*G11C 13/00* (2006.01)
*G11C 5/06* (2006.01)
*G11C 17/18* (2006.01)
*G11C 17/14* (2006.01)

(52) U.S. Cl.
CPC ............ *G11C 13/003* (2013.01); *G11C 5/063* (2013.01); *G11C 17/146* (2013.01); *G11C 17/18* (2013.01)

(58) Field of Classification Search
CPC .................................................... G11C 13/003
USPC ...................................................... 365/225.7
See application file for complete search history.

(56) References Cited

U.S. PATENT DOCUMENTS

| 9,607,694 B1 | 3/2017 | Ichihara |
| 10,096,359 B2 | 10/2018 | Yoshimoto et al. |
| 2008/0048164 A1* | 2/2008 | Odagawa ............ H01L 45/1625 257/2 |
| 2009/0109728 A1* | 4/2009 | Maejima .............. G11C 13/004 365/148 |
| 2010/0232206 A1* | 9/2010 | Li ....................... G11C 11/1677 365/148 |
| 2013/0308369 A1* | 11/2013 | Lu ........................ H01L 27/101 365/148 |
| 2014/0269001 A1* | 9/2014 | Kumar ................ G11C 13/0007 365/148 |
| 2015/0263069 A1* | 9/2015 | Jo ............................ H01L 45/16 365/148 |
| 2016/0232959 A1* | 8/2016 | Lee .......................... H01L 43/10 |
| 2018/0019391 A1 | 1/2018 | Ohba |
| 2018/0204881 A1 | 7/2018 | Sei |

FOREIGN PATENT DOCUMENTS

JP  2011-018838 A  1/2011

* cited by examiner

Primary Examiner — Muna A Techane
(74) Attorney, Agent, or Firm — Foley & Lardner LLP

(57) ABSTRACT

According to one embodiment, a semiconductor storage device includes a first wiring, a first resistance change element which is connected to the first wiring, a first nonlinear element which is connected to the first resistance change element, and a second wiring which is connected to the first nonlinear element. In a read operation for the first resistance change element, a voltage between the first wiring and the second wiring increases to a first voltage, and after the voltage between the first wiring and the second wiring increases to the first voltage, the voltage between the first wiring and the second wiring increases to a second voltage which is larger than the first voltage.

13 Claims, 11 Drawing Sheets

SEMICONDUCTOR STORAGE DEVICE

CROSS-REFERENCE TO RELATED APPLICATION(S)

This application is based upon and claims the benefit of priority from Japanese Patent Application No. 2019-040269, filed Mar. 6, 2019, the entire contents of which are incorporated herein by reference.

FIELD

Embodiments described herein relate generally to a semiconductor storage device.

BACKGROUND

It is known a semiconductor storage device which includes a first wiring, a first resistance change element connected to the first wiring, a first nonlinear element connected to the first resistance change element, and a second wiring connected to the first nonlinear element.

Examples of related art include JP-A-2011-18838.

DETAILED DESCRIPTION

Figure 1:
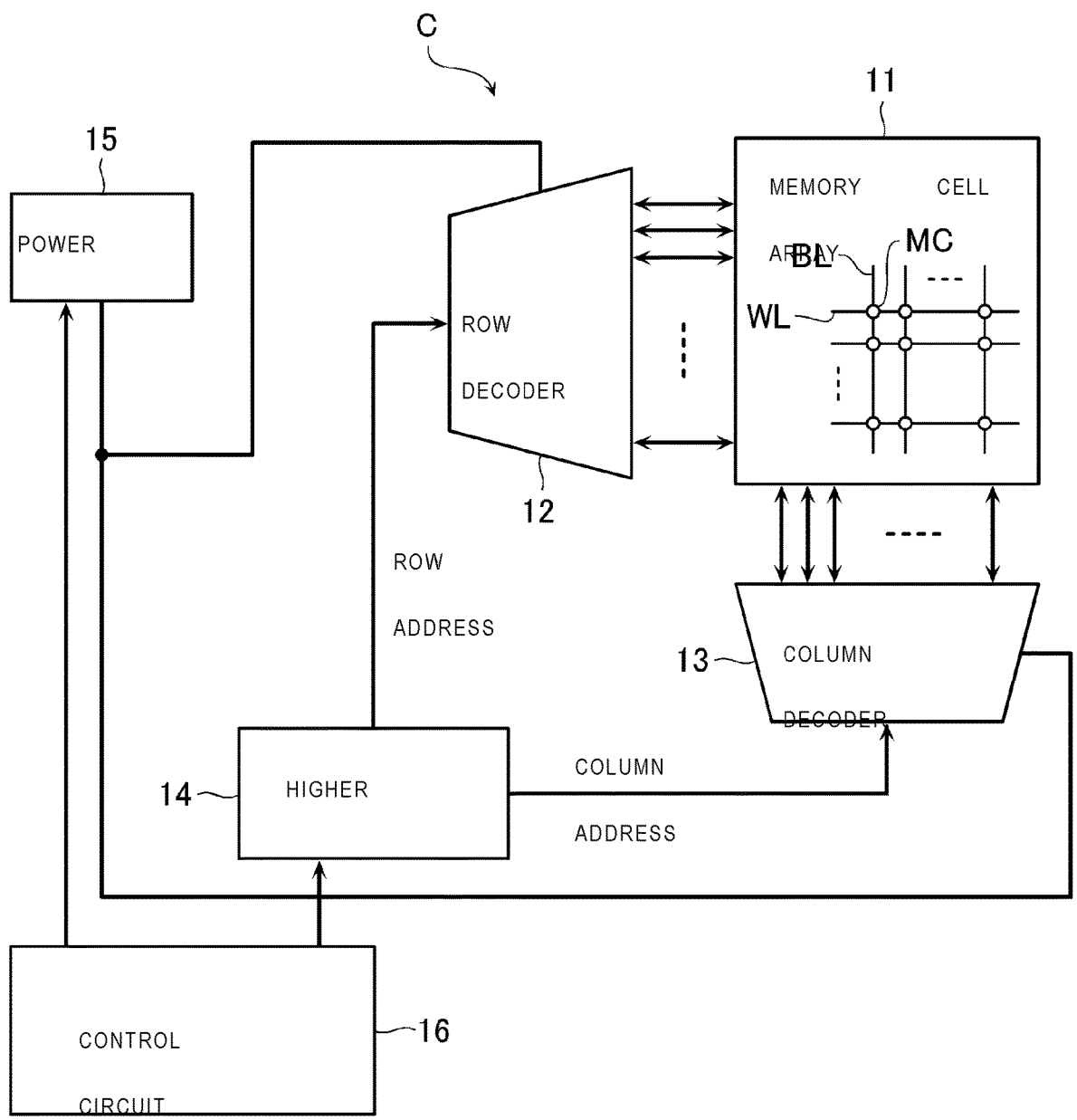
FIG. 1 is a schematic block diagram showing a configuration of a part of a semiconductor storage device according to a first embodiment.

Embodiments provide a semiconductor storage device in which a suitable read operation and a long life are realized.

In general, according to one embodiment, the semiconductor storage device includes a first wiring, a first resistance change element connected to the first wiring, a first nonlinear element connected to the first resistance change element, and a second wiring connected to the first nonlinear element. In a read operation for the first resistance change element, the semiconductor storage device is configured such that a voltage between the first wiring and the second wiring is increased to a first voltage determined based on a histogram of read threshold voltages of a plurality of memory cells in the semiconductor storage device. After the voltage between the first wiring and the second wiring is increased to the first voltage, the voltage between the first wiring and the second wiring is increased to a second voltage which is greater than the first voltage and determined based on the histogram.

According to one embodiment, the semiconductor storage device includes a first wiring, a first resistance change element which is connected to the first wiring, a first nonlinear element which is connected to the first resistance change element, a second wiring which is connected to the first nonlinear element, and a peripheral circuit which is connected to the first wiring and the second wiring.

In a read operation for the first resistance change element, the peripheral circuit increases a voltage between the first wiring and the second wiring until a current flowing through the first resistance change element is larger than a first current, and in a predetermined timing after the current flowing through the first resistance change element is larger than the first current, outputs a first signal when the current flowing through the first resistance change element is smaller than a second current, and outputs a second signal when the current flowing through the first resistance change element is larger than the second current.

Next, a semiconductor storage device according to embodiments will be described in detail with reference to the drawings. The following embodiments are merely examples, and are not intended to limit the present disclosure.

In the specification, a predetermined direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

In the specification, a direction along a predetermined plane may be referred to as a first direction, a direction intersecting the first direction along the predetermined plane may be referred to as a second direction, and a direction intersecting the predetermined plane may be referred to as a third direction. The first direction, the second direction, and the third direction may or may not correspond to the X direction, the Y direction, and the Z direction.

In the specification, expressions such as "up" and "down" are based on the substrate. For example, when the first direction intersects the surface of the substrate, a direction away from the substrate along the first direction is referred to up and a direction approaching the substrate along the first direction is referred to down. In addition, when referring to a lower surface or a lower end of a certain configuration, it means a surface or an end part on the substrate side of the configuration, and when referring to an upper surface or an upper end, it means a surface or an end part on a side opposite to the substrate of the configuration. In addition, a surface intersecting the second direction or the third direction is referred to as a side surface.

In addition, in the specification, when it is described that a first configuration is "electrically connected" to a second configuration, the first configuration may be directly connected to the second configuration, and the first configuration may also be connected to the second configuration via a wiring, a semiconductor member, a transistor, or the like. For example, when three transistors are connected in series, even when a second transistor is in an OFF state, a first transistor is "electrically connected" to a third transistor.

Further, in the specification, when it is described that the first configuration is "electrically insulated" from the second configuration, it means a state where, for example, an insulating film or the like is provided between the first configuration and the second configuration, and there is no contact, wiring, or the like connecting the first configuration and the second configuration.

Furthermore, in the specification, when it is described that a circuit or the like "conducts" two wirings or the like, it means that, for example, the circuit or the like includes a transistor or the like, the transistor or the like is provided in a current path between the two wirings, and the transistor or the like is turned to a state of ON.

A circuit configuration of the semiconductor storage device according to the embodiment will be described below with reference to the drawings. The following drawings are schematic, and a part of the configuration may be omitted for convenience of explanation.

First Embodiment

[Configuration]

FIG. 1 is a block diagram of a semiconductor storage device according to a first embodiment. A semiconductor storage device 1 according to the present embodiment includes a memory cell array 11 including a plurality of memory cells MC, a row decoder 12 and a column decoder 13 which select a desired memory cell MC from the memory cell array 11, a higher block decoder 14 which provides a row address and a column address to the row decoder 12 and column decoder 13 respectively, a power supply 15 which supplies power to each unit of the semiconductor storage device 1, and a control circuit 16 which controls the above.

The memory cell array 11 includes the plurality of memory cells MC, a plurality of word lines WL, and a plurality of bit lines BL. The row decoder 12 includes a switch circuit which is connected to the plurality of word lines WL and brings the word line WL corresponding to the row address into conduction with a voltage supply line. The column decoder 13 includes a switch circuit which is connected to the plurality of bit lines BL and brings the bit line BL corresponding to the column addresses into conduction with the voltage supply line. In addition, the column decoder 13 includes a sense amplifier circuit which detects a current or a voltage of the bit line BL. The power supply 15 includes a booster circuit such as a charge pump circuit which boosts a power supply voltage and outputs the boosted power supply voltage to the voltage supply line, and a step-down circuit which steps down the power supply voltage, and outputs the step-down voltage to the voltage supply line. The control circuit 16 includes a sequencer which controls the above.

Figure 2:
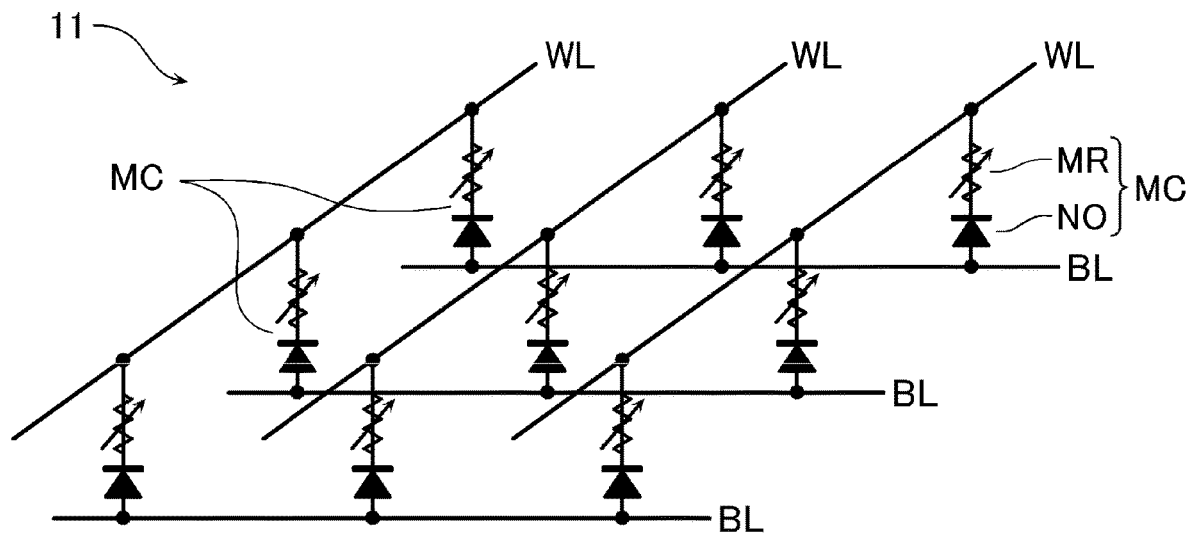
FIG. 2 is a schematic circuit diagram showing a configuration of a part of a memory cell array.
Figure 3:
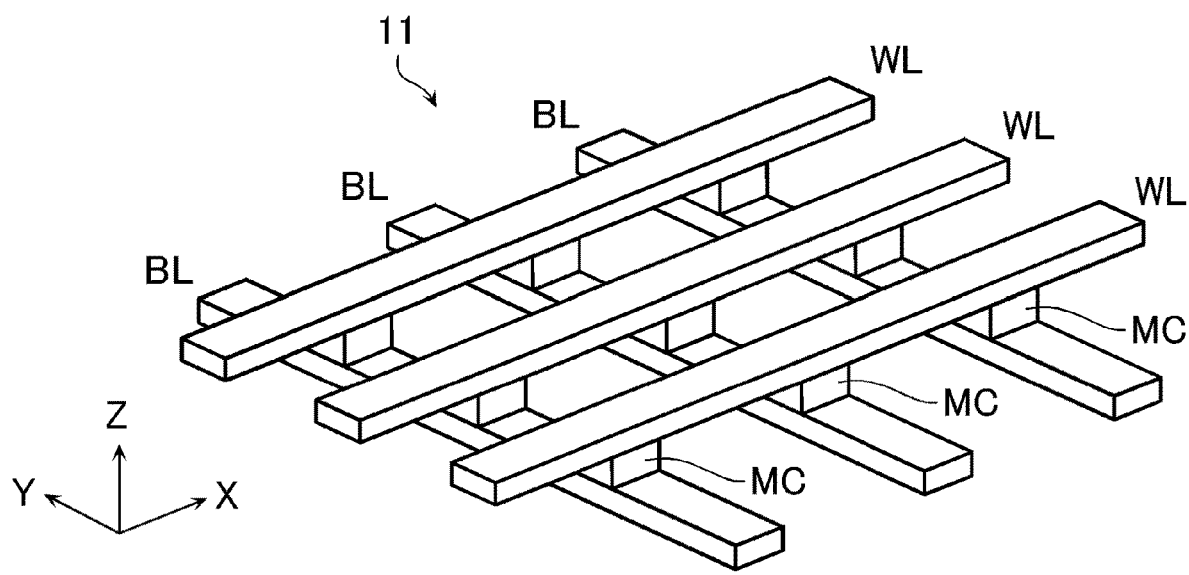
FIG. 3 is a schematic perspective view showing the configuration of the part of the memory cell array.

FIG. 2 is a schematic circuit diagram showing a configuration of the memory cell array 11. FIG. 3 is a schematic perspective view showing the configuration of the memory cell array 11.

For example, as shown in FIG. 3, the memory cell array 11 includes a plurality of bit lines BL extending in the X direction and in the Y direction, a plurality of word lines WL extending in the Y direction and in the X direction, and a plurality of memory cells MC arranged in the X direction and the Y direction corresponding to the bit line BL and the word line WL. In the example of FIG. 2, an anode of the memory cell MC is connected to the bit line BL, and a cathode of the memory cell MC is connected to the word line WL. The memory cell MC includes a magnetic resistance element MR and a nonlinear element NO. The magnetic resistance element MR functions as a resistance change element which records one bit or a plurality bit of data. The nonlinear element NO functions as a selector which selectively applies a voltage or flows a current to the resistance change element in the selected memory cell MC.

Figure 4:
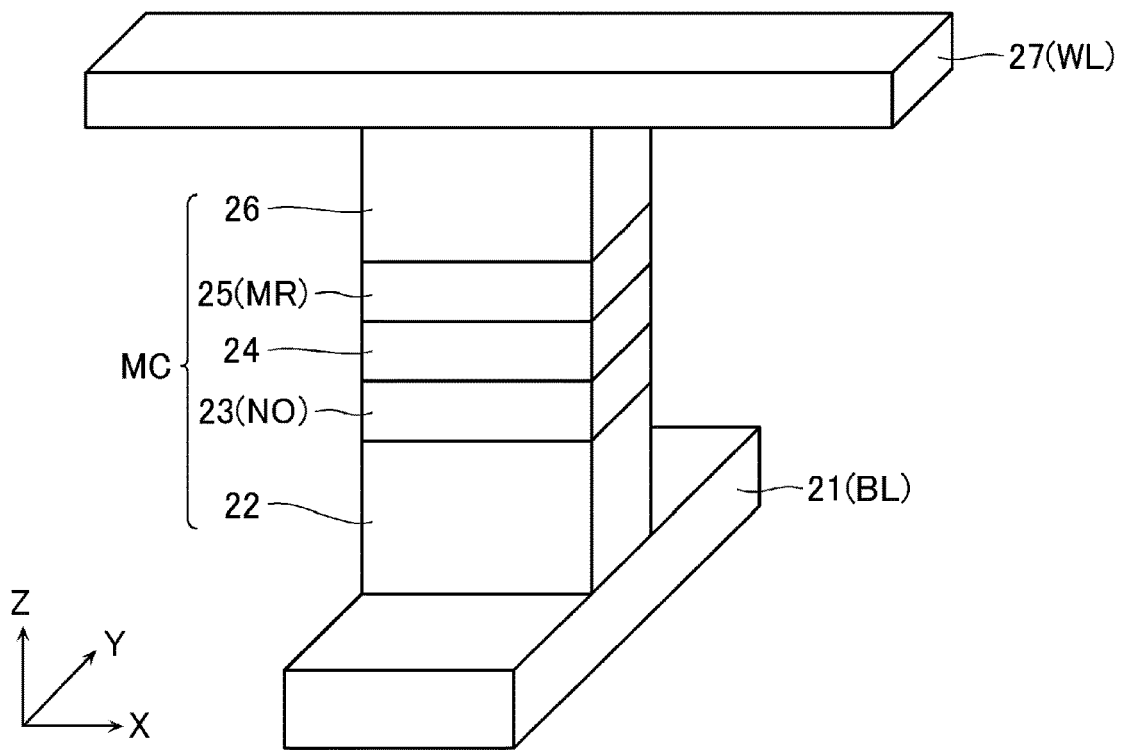
FIG. 4 is a schematic perspective view of a memory cell.

FIG. 4 is a schematic perspective view of the memory cell MC according to the present embodiment.

In FIG. 4, the memory cell MC includes a conductive layer 21, a conductive layer 22, a nonlinear layer 23, a conductive layer 24, a magnetic resistance layer 25, a conductive layer 26, and a conductive layer 27 which are successively stacked in the Z direction.

The conductive layer 21 functions as the bit line BL. The conductive layer 21 may be, for example, a stacked film of titanium nitride (TiN) and tungsten (W), or may also be polycrystalline silicon doped with an N-type impurity such as phosphorus (P).

The conductive layer 22 functions as the anode of the memory cell MC. The conductive layer 22 may contain, for example, a material same as that of the conductive layer 21. The conductive layer 22 has a function of preventing element diffusion from the nonlinear layer 23.

The nonlinear layer 23 functions as the nonlinear element NO. For example, when a voltage applied to (e.g., across) the nonlinear layer 23 is smaller than a predetermined threshold voltage, the nonlinear layer 23 is brought into a high-resistance state. When the voltage applied to the nonlinear layer 23 reaches the predetermined threshold voltage, the nonlinear layer 23 turns from an off state to an on state, and the current flowing through the nonlinear layer 23 increases by a plurality of digits. When the voltage applied to the nonlinear layer 23 falls below a predetermined hold voltage, the nonlinear layer 23 turns from an on state to an off state, and the current flowing through the nonlinear layer 23 decreases by a plurality of digits.

The nonlinear layer 23 contains, for example, at least one kind of chalcogen. The nonlinear layer 23 may also contain, for example, a chalcogenide which is a compound containing the chalcogen. In addition, the nonlinear layer 23 may contain at least one kind of element selected from the group consisting of B, Al, Ga, In, C, Si, Ge, Sn, As, P, and Sb.

The term "chalcogen" used herein excludes oxygen (O) among elements belonging to the sixteenth group in the periodic table. The chalcogen includes, for example, sulfur (S), selenium (Se), and tellurium (Te).

The nonlinear layer 23 may include a metal layer containing at least one of silver (Ag) and copper (Cu), or may include an insulating layer. In addition, the nonlinear layer 23 may have a stacked structure including a layer containing a chalcogen, a metal layer containing at least one of silver and copper, and an insulating layer.

The conductive layer 24 functions as an electrode which connects the nonlinear element NO and the magnetic resistance element MR. The conductive layer 24 may contain, for example, a material same as that of the conductive layer 21. The conductive layer 24 has a function of preventing element diffusion from the nonlinear layer 23.

The magnetic resistance layer 25 functions as the magnetic resistance element MR. The configuration of the magnetic resistance layer 25 will be described later with reference to FIG. 5.

The conductive layer 26 functions as the cathode of the memory cell MC. The conductive layer 26 may contain, for example, a material same as that of the conductive layer 21.

The conductive layer 27 functions as the word line WL. The conductive layer 27 may contain, for example, a material same as that of the conductive layer 21.

Figure 5:
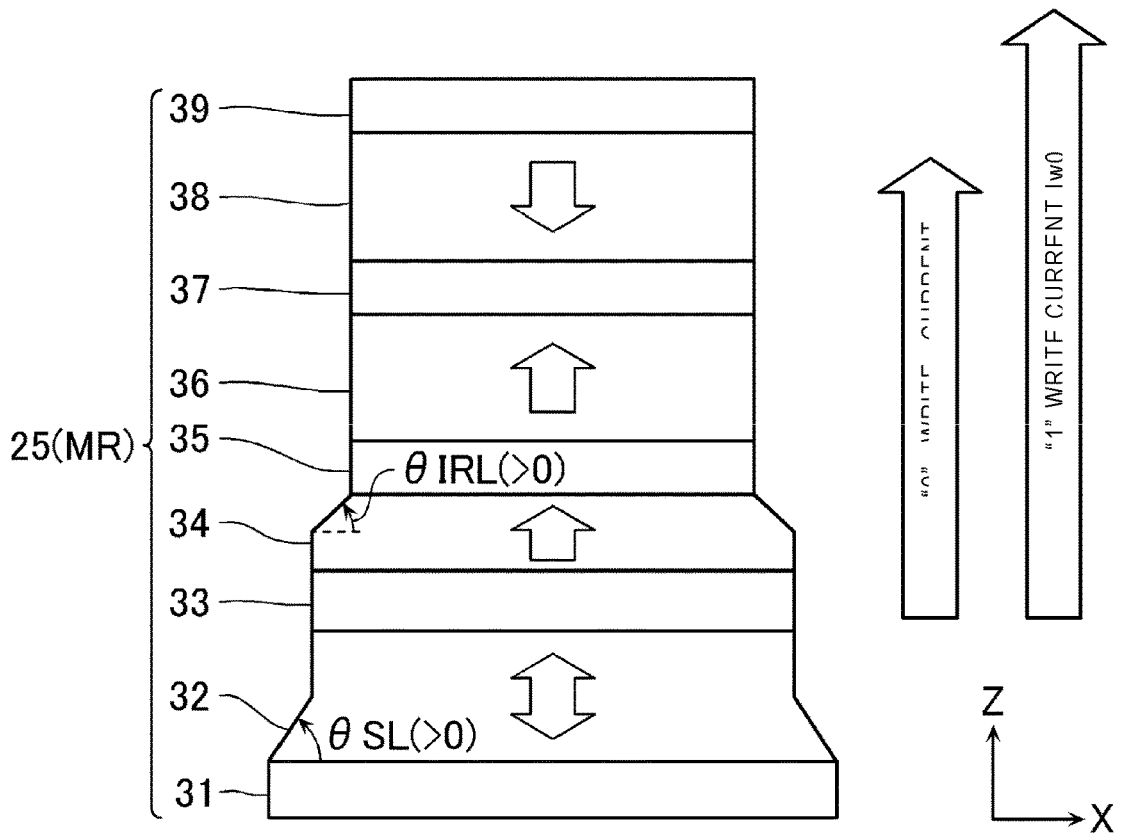
FIG. 5 is a schematic sectional view of a magnetic resistance element.

FIG. 5 is a schematic sectional view of the magnetic resistance layer 25 (magnetic resistance element MR) according to the present embodiment.

The magnetic resistance layer 25 (magnetic resistance element MR) according to the present embodiment includes a base layer 31, a magnetization free layer 32, a tunnel insulating layer 33, a first magnetization fixed layer 34, a spacer layer 35, a second magnetization fixed layer 36, a spacer layer 37, a shift cancel layer 38, and a cap layer 39 which are successively stacked in the Z direction.

The base layer 31 is an insulating layer of a nonmagnetic material. The base layer 31 may contain, for example, magnesium oxide (MgO), and may also contain other elements.

The magnetization free layer 32 is a conductive layer of a ferromagnetic material. The magnetization free layer 32 has a magnetization easy axis direction perpendicular to a film surface (Z direction). The magnetization free layer 32 may contain, for example, cobalt iron boron (CoFeB) or iron boride (FeB), and may also contain other elements.

The magnetization free layer 32 is configured to record data. For example, in a state where a magnetization direction of the magnetization free layer 32 is parallel to a magnetization direction of the first magnetization fixed layer 34 (an upward direction in the illustrated example, and hereinafter, the state is called a "parallel state"), a tunnel junction including the magnetization free layer 32, the tunnel insulating layer 33, and the first magnetization fixed layer 34 is brought into a low-resistance state. On the other hand, when the magnetization direction of the magnetization free layer 32 (a downward direction in the illustrated example) is antiparallel (or opposite) to the magnetization direction of the first magnetization fixed layer 34 (hereinafter, the state is called an "antiparallel state"), the tunnel junction is brought into a high-resistance state due to the tunnel magneto resistance effect (TMR). For example, data "0" is assigned in the low-resistance state, and data "1" is assigned in the high-resistance state.

In the magnetization free layer 32, for example, the area of the upper surface is smaller than the area of the lower surface. The magnetization free layer 32 includes a part which is tapered at a taper angle θSL (θ>0). The tapered part of the magnetization free layer 32 is provided, for example, near an interface with the base layer 31.

The tunnel insulating layer 33 is an insulating layer of a nonmagnetic material. The tunnel insulating layer 33 may contain, for example, magnesium oxide (MgO), and may also contain other elements.

The first magnetization fixed layer 34 is a conductive layer of a ferromagnetic material. The first magnetization fixed layer 34 has a magnetization easy axis direction perpendicular to the film surface (Z direction). In the illustrated example, the magnetization direction of the first magnetization fixed layer 34 is the upward direction. The first magnetization fixed layer 34 may contain, for example, a compound containing an element selected from cobalt, iron or nickel (Ni), and an element selected from boron (B), phosphorus (P), carbon (C) or nitrogen (N), and may also contain other elements.

In the first magnetization fixed layer 34, for example, the area of the upper surface is smaller than the area of the lower surface. The first magnetization fixed layer 34 includes a part which is tapered at a taper angle θIRL (θ>0). The tapered part of the first magnetization fixed layer 34 is provided, for example, near an interface with the spacer layer 35.

The spacer layer 35 is a conductive layer of a nonmagnetic material. The spacer layer 35 may contain, for example, at least one of tantalum (Ta), hafnium (Hf), tungsten (W), zirconium (Zr), molybdenum (Mo), niobium (Nb), and titanium (Ti), and may also contain other elements.

The second magnetization fixed layer 36 is a conductive layer of a ferromagnetic material. The second magnetization fixed layer 36 has a magnetization easy axis direction perpendicular to the film surface (Z direction). The magnetization direction of the second magnetization fixed layer 36 is parallel to the magnetization direction of the first magnetization fixed layer 34 in a steady state. In the illustrated example, the magnetization direction of the second magnetization fixed layer 36 is the upward direction. The second magnetization fixed layer 36 may contain, for example, cobalt platinum (CoPt), cobalt nickel (CoNi), or cobalt palladium (CoPd), and may also contain other elements.

The spacer layer 37 is a conductive layer of a nonmagnetic material. The spacer layer 37 may contain, for example, ruthenium (Ru), osmium (Os), iridium (Ir), vanadium (V), or chromium (Cr), and may also contain other elements.

The shift cancel layer 38 is a conductive layer of a ferromagnetic material. The shift cancel layer 38 has a magnetization easy axis direction in the direction perpendicular to the film surface (Z direction). The magnetization direction of the second magnetization fixed layer 36 is antiparallel to the magnetization direction of the first magnetization fixed layer 34 in a steady state. In the illustrated example, the magnetization direction of the shift cancel layer 38 is the downward direction. The shift cancel layer 38 may contain, for example, a cobalt platinum alloy (CoPt), cobalt nickel alloy (CoNi), or a cobalt palladium alloy (CoPd), and may also contain other elements.

The cap layer 39 is a conductive layer of a nonmagnetic material. The cap layer 39 may contain, for example, at least one of platinum (Pt), tungsten (W), tantalum (Ta) and ruthenium (Ru), and may also contain other elements.

[Operation]

Next, the operation of the semiconductor storage device according to the present embodiment will be described.

[Write Operation]

Figure 6:
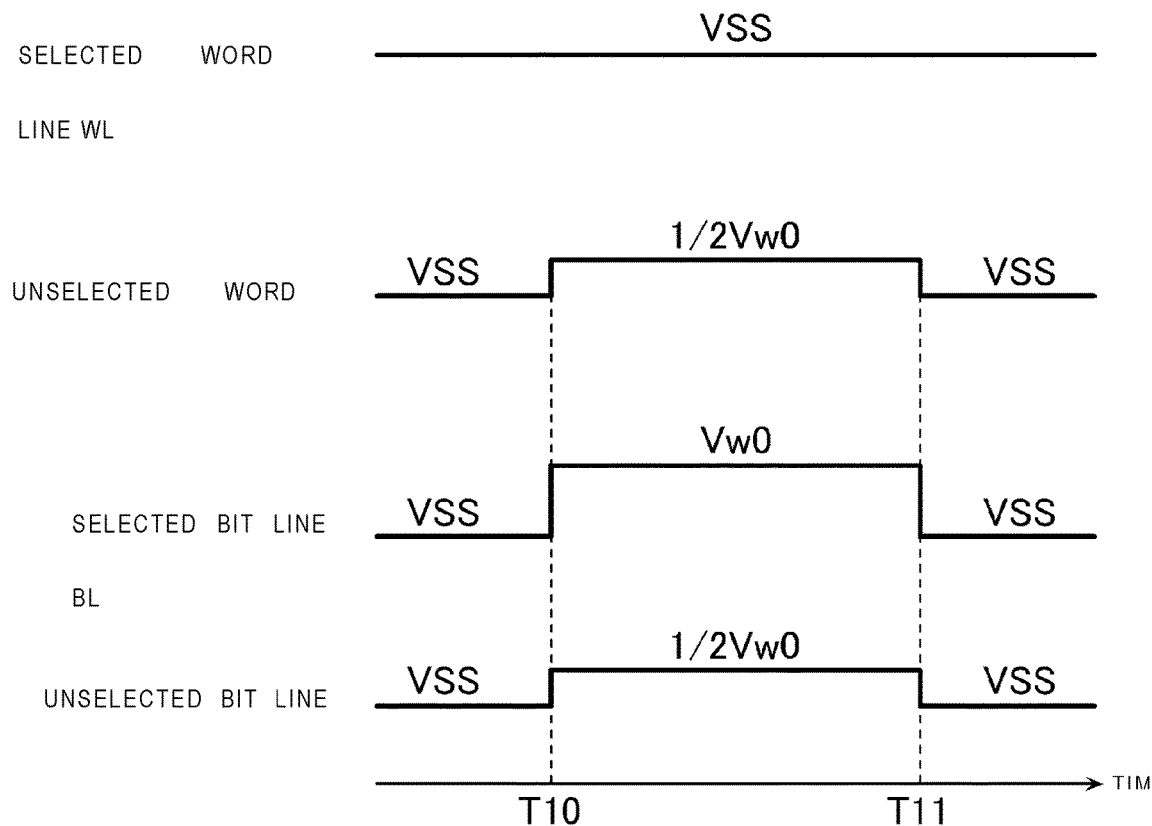
FIG. 6 is a timing chart illustrating a write operation according to the first embodiment.

First, a write operation of changing the memory cell MC from a high-resistance state to a low-resistance state will be described with reference to FIG. 6 or the like. FIG. 6 is a schematic timing chart showing voltages of the word line WL and the bit line BL in the write operation.

In the write operation, for example, from a timing T10 to a timing T11, the voltage of the selected word line WL is set to a voltage VSS (≈0 V), the voltage of the selected bit line BL is set to a voltage Vw0 (>VSS), and the voltages of the unselected word line WL and the unselected bit line BL are set to a voltage ½Vw0.

The voltage Vw0 is applied to the selected memory cell MC connected to the selected word line WL and the selected bit line BL, the nonlinear layer 23 (FIG. 4) is brought into an on state, and the current flows from the selected bit line BL to the selected word line WL.

Accordingly, a spin torque corresponding to the magnetization direction (downward direction) of the shift cancel layer 38 (FIG. 5) is injected from the shift cancel layer 38 into the second magnetization fixed layer 36 and the first magnetization fixed layer 34. The spin torque at this time does not have a magnitude that can reverse the magnetization directions of the second magnetization fixed layer 36 and the first magnetization fixed layer 34. Therefore, the magnetization directions of the second magnetization fixed layer 36 and the first magnetization fixed layer 34 are maintained in the magnetization direction (upward direction) in the steady state.

In addition, a spin torque corresponding to the magnetization direction (upward direction) of the first magnetization fixed layer 34 (FIG. 5) is injected from the first magnetization fixed layer 34 to the magnetization free layer 32. The spin torque at this time has a magnitude that can reverse the magnetization direction of the magnetization free layer 32. Therefore, the magnetization direction of the magnetization free layer 32 is parallel to the magnetization direction (upward direction) of the first magnetization fixed layer 34. The magnetization direction of the magnetization free layer 32 is kept in the upward direction at and after the timing T11.

Either the voltage ½Vw0 or VSS is concurrently applied to the unselected memory cell MC via at least one of the unselected word line WL and the unselected bit line BL. In this case, the nonlinear layer 23 (FIG. 4) is in an off state, and almost no current flows in the unselected memory cell MC.

[Erase Operation]

Figure 7:
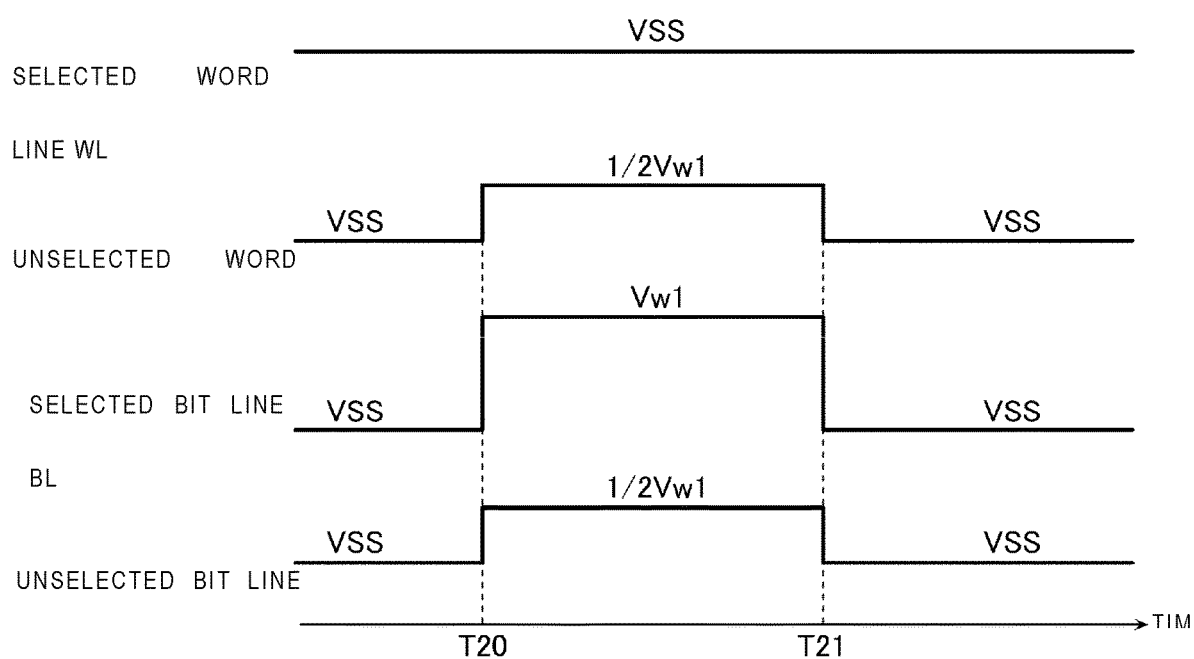
FIG. 7 is a timing chart illustrating an erase operation according to the first embodiment.

Next, an erase operation of changing the memory cell MC from a low-resistance state to a high-resistance state will be described with reference to FIG. 7 or the like. FIG. 7 is a schematic timing chart showing voltages of the word line WL and the bit line BL in the erase operation.

In the erase operation, for example, from a timing T20 to a timing T21, the voltage of the selected word line WL is set to the voltage VSS (≈0 V), the voltage of the selected bit line BL is set to a voltage Vw1 (>Vw0), and the voltages of the unselected word line WL and the unselected bit line BL are set to a voltage ½Vw1.

The voltage Vw1 is applied to the selected memory cell MC connected to the selected word line WL and the selected bit line BL, the nonlinear layer 23 (FIG. 4) is brought into a low-resistance state, and the current flows from the selected bit line BL to the selected word line WL.

Accordingly, a spin torque corresponding to the magnetization direction (downward direction) of the shift cancel layer 38 (FIG. 5) is injected from the shift cancel layer 38 into the second magnetization fixed layer 36 and the first magnetization fixed layer 34. The spin torque at this time has a magnitude which reverses the magnetization directions of the second magnetization fixed layer 36 and the first magnetization fixed layer 34. Therefore, the magnetization directions of the second magnetization fixed layer 36 and the first magnetization fixed layer 34 are temporarily reversed.

In addition, a spin torque corresponding to the magnetization direction (downward direction) of the first magnetization fixed layer 34 (FIG. 5) is injected from the first magnetization fixed layer 34 to the magnetization free layer 32. The spin torque at this time has a magnitude which reverses the magnetization direction of the magnetization free layer 32. Therefore, the magnetization direction of the magnetization free layer 32 is parallel to the magnetization direction (downward direction) of the first magnetization fixed layer 34. The magnetization direction of the magnetization free layer 32 is kept in the downward direction at and after the timing T21. On the other hand, the magnetization directions of the first magnetization fixed layer 34 and the second magnetization fixed layer 36 return to the upward direction at and after the timing T21.

Either the voltage ½Vw1 or VSS is concurrently applied to the unselected memory cell MC via at least one of the unselected word line WL and the unselected bit line BL. In this case, the nonlinear layer 23 (FIG. 4) is in an off state, and almost no current flows in the unselected memory cell MC.

[Read Operation]

Next, a read operation of reading data from the memory cell MC will be described.

First, the current-voltage characteristic of the memory cell MC will be described with reference to FIG. 8 to FIG. 10.

Figure 8:
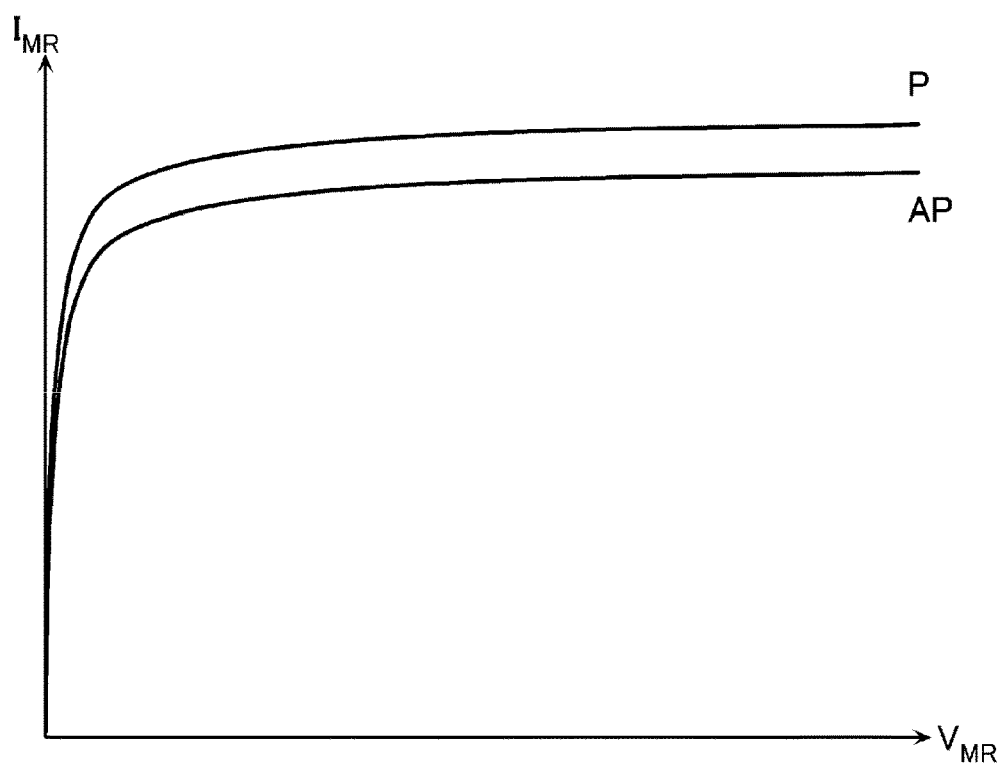
FIG. 8 is a schematic graph showing a current-voltage characteristic of the magnetic resistance element.

FIG. 8 is a schematic graph showing the current-voltage characteristic of the magnetic resistance element MR. The horizontal axis shows a voltage $V_{MR}$ between the cathode and the anode of the magnetic resistance element MR. The vertical axis shows a current $I_{MR}$ flowing in the magnetic resistance element MR in a logarithmic axis.

The characteristic indicated by P in the figure shows the characteristic of the magnetic resistance element MR in the parallel state. The characteristic indicated by AP in the figure shows the characteristic of the magnetic resistance element MR in the antiparallel state. As described above, the resistance value of the magnetic resistance element MR in the antiparallel state is larger than the resistance value of the magnetic resistance element MR in the parallel state.

Figure 9:
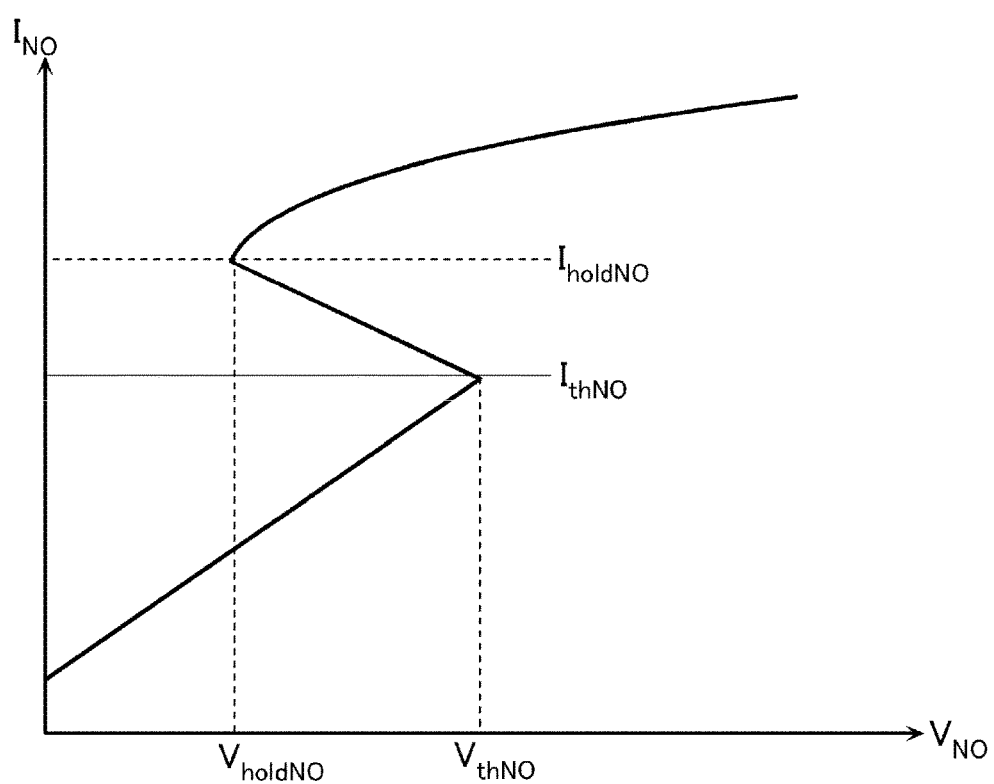
FIG. 9 is a schematic graph showing a current-voltage characteristic of a nonlinear element.

FIG. 9 is a schematic graph showing a current-voltage characteristic of the nonlinear element NO. The horizontal axis shows a voltage $V_{NO}$ between the cathode and the anode of the nonlinear element NO. The vertical axis shows a current $I_{NO}$ flowing in the nonlinear element NO in a logarithmic axis.

In a range where the current $I_{NO}$ is smaller than a predetermined current value $I_{thNo}$, the voltage $V_{NO}$ increases monotonically in accordance with the increase of the current $I_{NO}$. When the current $I_{NO}$ reaches the current value $I_{thNo}$, the voltage $V_{NO}$ reaches a voltage $V_{thNo}$.

In a range where the current $I_{NO}$ is larger than the current value $I_{thNo}$ and smaller than a current value $I_{holdNO}$ the voltage $V_{NO}$ decreases monotonically in accordance with the increase of the current $I_{NO}$. When the current $I_{NO}$ reaches the current value $T_{holdNo}$, the voltage $V_{NO}$ reaches a voltage $V_{holdNO}$.

In a range where the current $I_{NO}$ is larger than the current value $T_{holdNo}$, the voltage $V_{NO}$ increases monotonically in accordance with the increase of the current $I_{No}$.

Figure 10:
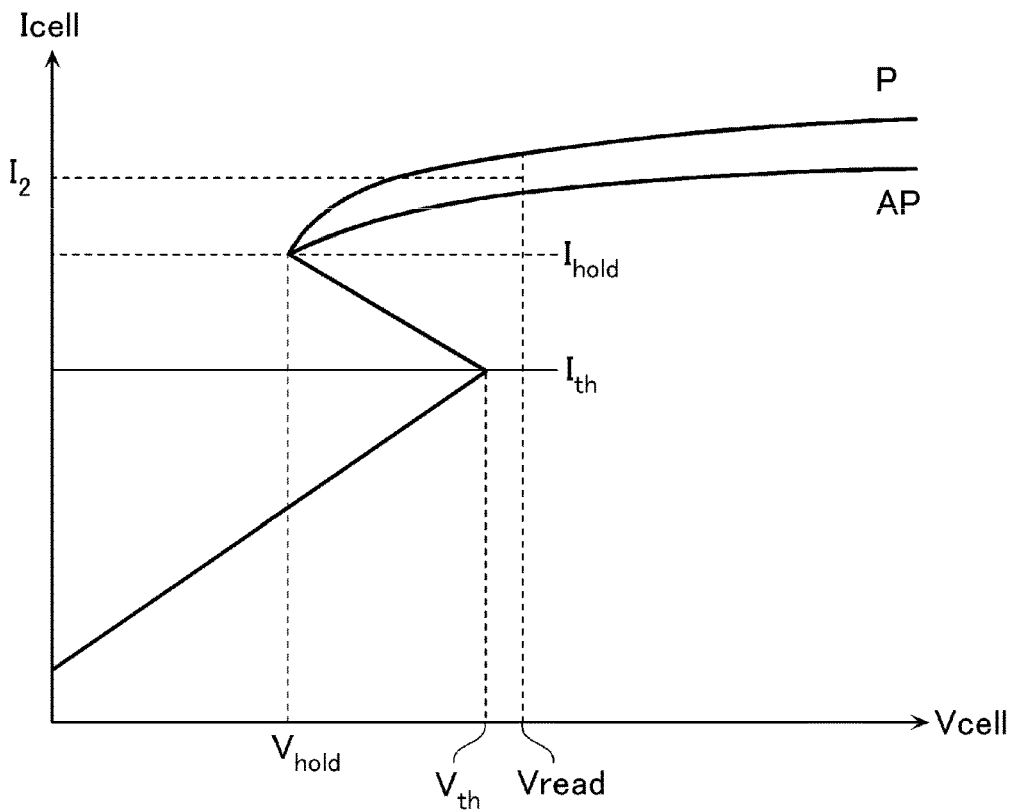
FIG. 10 is a schematic graph showing a current-voltage characteristic of the memory cell.

FIG. 10 is a schematic graph showing a current-voltage characteristic of the memory cell MC (e.g., when coupling the magnetic resistance element MR to the nonlinear element NO). The horizontal axis shows a cell voltage Vcell, which is a voltage difference between the cathode and the anode of the selected memory cell MC. The vertical axis shows a cell current Icell flowing to the selected memory cell MC in a logarithmic axis.

In a range where the cell current Icell is smaller than a predetermined current value $I_{th}$, the cell voltage Vcell increases monotonically in accordance with the increase of the cell current Icell. When the cell current Icell reaches the current value $I_{th}$, the cell voltage Vcell of the memory cell MC reaches a voltage $V_{th}$.

In a range where the cell current Icell is larger than the current value $I_{th}$ and smaller than a current value $I_{hold}$, the cell voltage Vcell decreases monotonically in accordance with the increase of the cell current Icell. When the cell current Icell reaches the current value $I_{hold}$, the cell voltage Vcell of the memory cell MC reaches a voltage $V_{hold}$.

In a range where the cell current Icell is larger than the current value $I_{hold}$, the cell voltage Vcell increases monotonically in accordance with the increase of the cell current Icell. When the cell voltage Vcell is a voltage Vread larger than the voltage $V_{th}$, a current larger than a predetermined current $I_2$ flows in the memory cell MC including the magnetic resistance element MR in a low-resistance state, and a current smaller than the predetermined current $I_2$ flows in the memory cell MC including the magnetic resistance element MR in a high-resistance state.

Therefore, for the read operation, the cell voltage Vcell is set to the voltage Vread, data "0" (which corresponds to the magnetic resistance element MR being in the low-resistance state) is output when the cell current Icell is larger than the current $I_2$, and data "1" (which corresponds to the magnetic resistance element MR being in the high-resistance state) is output when the cell current Icell is smaller than the current $I_2$.

Figure 11:
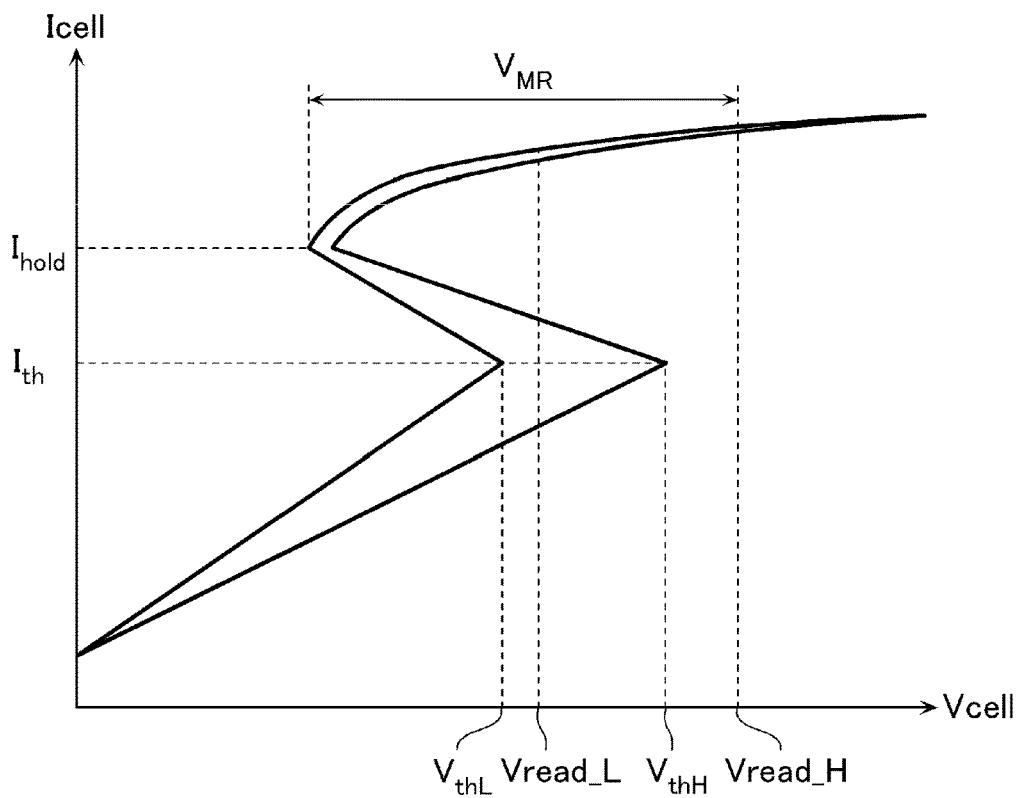
FIG. 11 is a schematic graph showing a variation in the current-voltage characteristic of the memory cell.

Here, a variation may be present in the electrical characteristics of the nonlinear elements NO between the plurality of memory cells MC in the memory cell array 11 (FIG. 2). For example, as shown in FIG. 11, the nonlinear layer 23 (FIG. 4) in one memory cell MC may brought into an on state by the application of a voltage $V_{th1}$, while the nonlinear layer 23 in another memory cell MC may not be brought into an on state until a voltage $V_{thH}$ larger than the voltage $V_{thL}$ is applied.

For example, when the read operation is performed using a voltage Vread_L between the voltage $V_{thL}$ and the voltage $V_{thH}$, the nonlinear layer 23 is not brought into an on state in the read operation for a part of the memory cells MC, and data of such memory cells MC cannot be read. On the other hand, when the read operation is performed using a voltage Vread_H larger than the voltage $V_{thH}$, an excessively large voltage is applied to the magnetic resistance layer 25 (FIG. 5) of a part of the memory cells MC, and defects may occur in the tunnel insulating layer 33 or the like.

Therefore, in the present embodiment, the cell voltage Vcell is increased until the nonlinear layer 23 is brought into an on state, and the data recorded in the memory cell MC is determined based on the cell current Icell in a timing after the nonlinear layer 23 is brought into an on state.

According to such a method, it is possible to realize the read operation by bringing the nonlinear layer 23 into an on state using a suitable voltage in the read operation. In addition, since the application of the voltage can be terminated at a time when the nonlinear layer 23 of the selected memory cell MC is in an on state, it is possible to prevent the application of a voltage equal to or larger than a value necessary for the selected memory cell MC. Therefore, the long life of the semiconductor storage device can be realized.

Next, the read operation according to the present embodiment will be described in more details.

Figure 12:
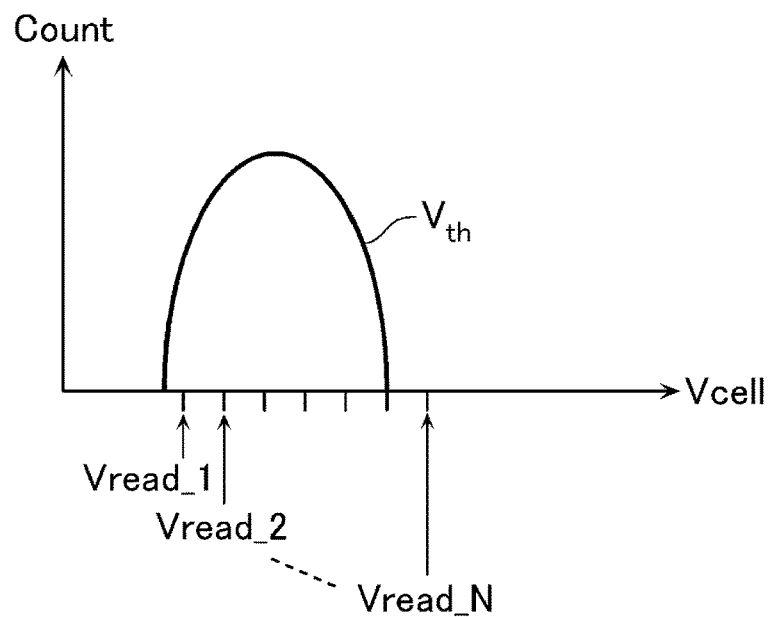
FIG. 12 is a histogram illustrating a read operation according to the first embodiment.

FIG. 12 is a diagram illustrating the read operation according to the present embodiment. FIG. 12 is a histogram showing a variation in the voltage $V_{th}$ in the memory cell array 11. The horizontal axis shows the cell voltage Vcell. The vertical axis shows the number of memory cells MC including the nonlinear layer 23 (FIG. 4) which turns from an off state to an on state at a predetermined cell voltage Vcell.

In addition, FIG. 12 illustrates voltages Vread_1 to Vread_N (N is an integer of 2 or more) used in the read operation according to the present embodiment. In the illustrated example, a voltage Vread_K (K is an integer of or more and N−1 or less) is smaller than a voltage Vread_K+1. In addition, the voltage Vread_1 is larger than a lower tail of a distribution of the voltage $V_{th}$, and the voltage Vread_N is larger than an upper tail of the distribution of the voltage $V_{th}$. The voltage Vread_N may be smaller than the voltage Vw0 (FIG. 6).

Figure 13:
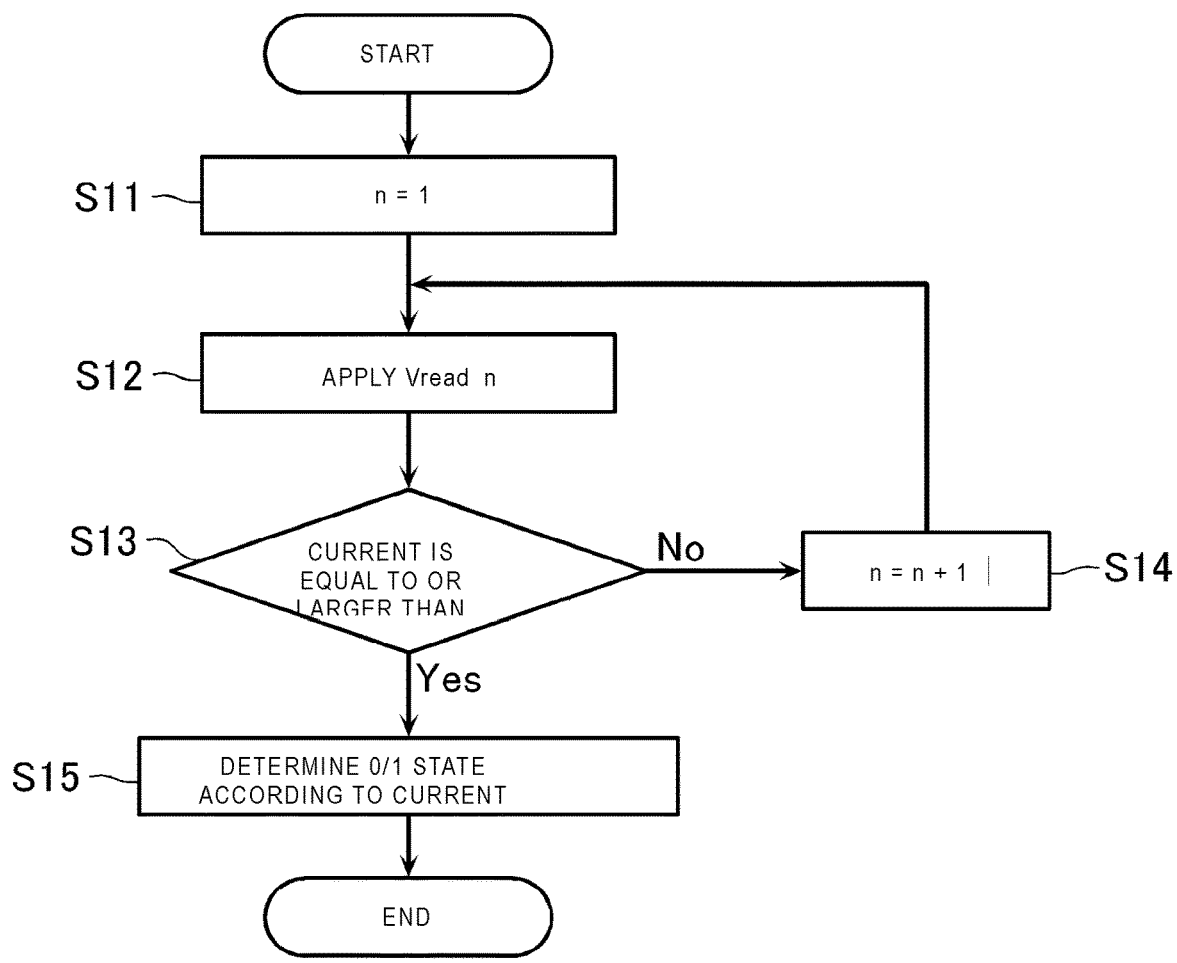
FIG. 13 is a flowchart illustrating the same read operation.

FIG. 13 is a flowchart illustrating the read operation according to the present embodiment. The illustrated operation is realized by, for example, the sequencer, a register, and a firmware in the control circuit 16 (FIG. 1).

In step S11, a variable n is set to 1. The variable n is stored in, for example, the register in the control circuit 16.

In step S12, the cell voltage Vcell is set to a voltage Vread_n. For example, the control circuit 16 refers to the variable n and output a control signal to the power supply 15 by a sequencer or the like. The power supply 15 generates, according to the variable n, the voltage Vread_n based on the control signal, and output the voltage to the voltage supply line. The column decoder 13 brings the voltage supply line into conduction with the selected bit line BL, and supplies the voltage Vread_n to the selected bit line BL. The row decoder 12 supplies the voltage VSS to the selected word line WL. In step S12, the voltages of the unselected bit line BL and the unselected word line WL may be set to a voltage ½Vread_n, or may be set to a voltage ½Vread_N (see FIG. 12).

In step S13, it is determined whether the cell current Icell is equal to or larger than the current $I_1$. The current $I_1$ is set in a range, for example, equal to or larger than the current $I_{th}$ and equal to or smaller than the current $I_{hold}$ in FIG. 10. Data indicating whether the cell current Icell is equal to or larger than the current $I_1$ is output from the sense amplifier circuit in the column decoder 13, and the determination is performed based on the data, for example. When the cell current Icell is not equal to or larger than the current $I_1$, the process proceeds to step S14. When the cell current Icell is equal to or larger than the current $I_1$, the process proceeds to step S15.

In step S14, it is determined whether the variable n has reached N, for example. When the variable n has not reached N, 1 is added to the variable n, and the process proceeds to step S12. When the variable n reaches N, for example, a signal indicating that the read operation is not normally ended is output, and the read operation is ended.

In step S15, it is determined whether the cell current Icell flowing in the memory cell MC to which the voltage Vread_n is applied is equal to or larger than the current $I_2$ in FIG. 10, and the cell voltage Vcell is set to VSS. Data indicating whether the cell current Icell is equal to or larger than the current $I_2$ is output from the sense amplifier circuit in the column decoder 13, and the determination is performed based on the data, for example. When the cell current Icell is not equal to or larger than the current $I_2$, data "1" is output, and the read operation is ended. When the cell current Icell is equal to or larger than the current $I_2$, data "0" is output, and the read operation is ended.

Figure 14:
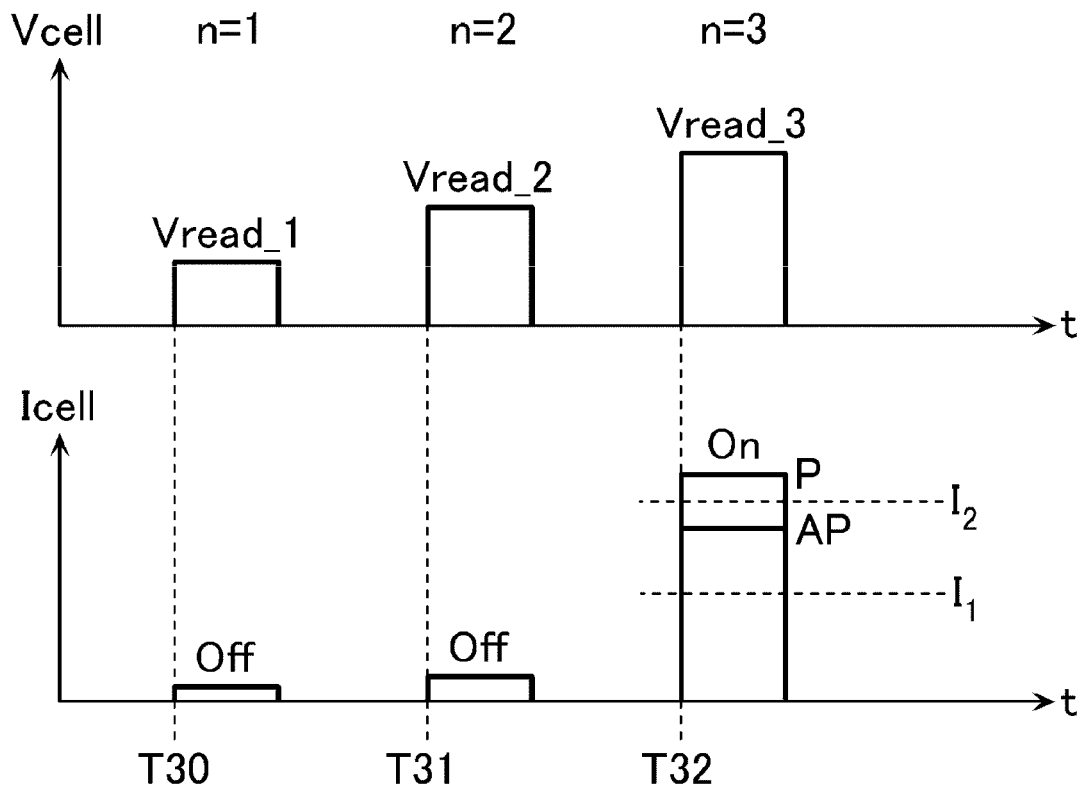
FIG. 14 is a timing chart illustrating the same read operation.

FIG. 14 is a schematic timing chart illustrating the read operation according to the present embodiment.

At a timing T30, the variable n is set to 1. Accordingly, the cell voltage Vcell is set to the voltage Vread_1. At this time, in the selected memory cell MC, the nonlinear layer 23 is in an off state and the cell current Icell is smaller than the current $I_1$.

At a timing T31, the variable n is set to 2. Accordingly, the cell voltage Vcell is set to the voltage Vread_2. At this time, in the selected memory cell MC, the nonlinear layer 23 is in an off state and the cell current Icell is smaller than the current $I_1$.

At a timing T32, the variable n is set to 3. Accordingly, the cell voltage Vcell is set to the voltage Vread_3. At this time, in the selected memory cell MC, the nonlinear layer 23 turns into an on state and the cell current Icell becomes larger than the current $I_1$. Here, when the cell current Icell is not equal to or larger than the current $I_2$, the data "1" is output. When the cell current Icell is equal to or larger than the current $I_2$, the data "0" is output.

FIG. 14 shows an example in which the nonlinear layer 23 (FIG. 4) is not brought into an on state at a timing when the cell voltage Vcell is the voltage Vread_2, and the nonlinear layer 23 is brought into an on state at a timing when the cell voltage Vcell is the voltage Vread_3. However, as described above, in the plurality of memory cells MC in the memory cell array 11, the characteristics of the nonlinear layer 23 may vary. Therefore, when another memory cell MC is the selected memory cell MC, there may be a case where the nonlinear layer 23 is brought into an on state by the application of the voltage Vread_1 or the voltage Vread_2, and there may be a case where the nonlinear layer 23 is not brought into an on state by the application of the voltage Vread_3. In the former case, the voltage Vread_3 is not applied to the selected memory cell MC. In the latter case, the voltage Vread_4 is applied to the selected memory cell MC. That is, according to a read method of the present embodiment, a maximum voltage applied during the read operation may be different depending on the memory cell MC.

Second Embodiment

Figure 15:
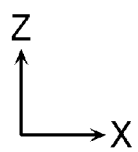
FIG. 15 is a schematic sectional view of a magnetic resistance element according to a second embodiment.
Figure 15:
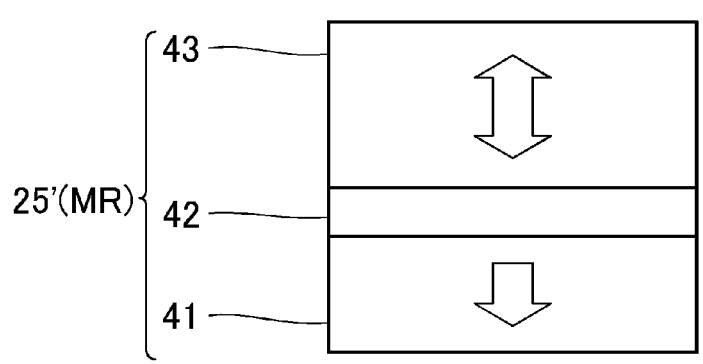
Figure 15:
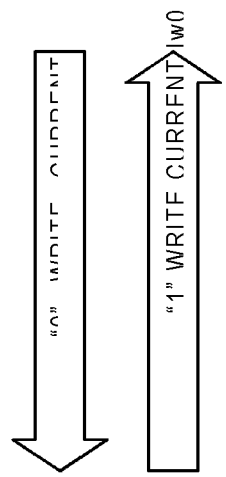
Figure 16:
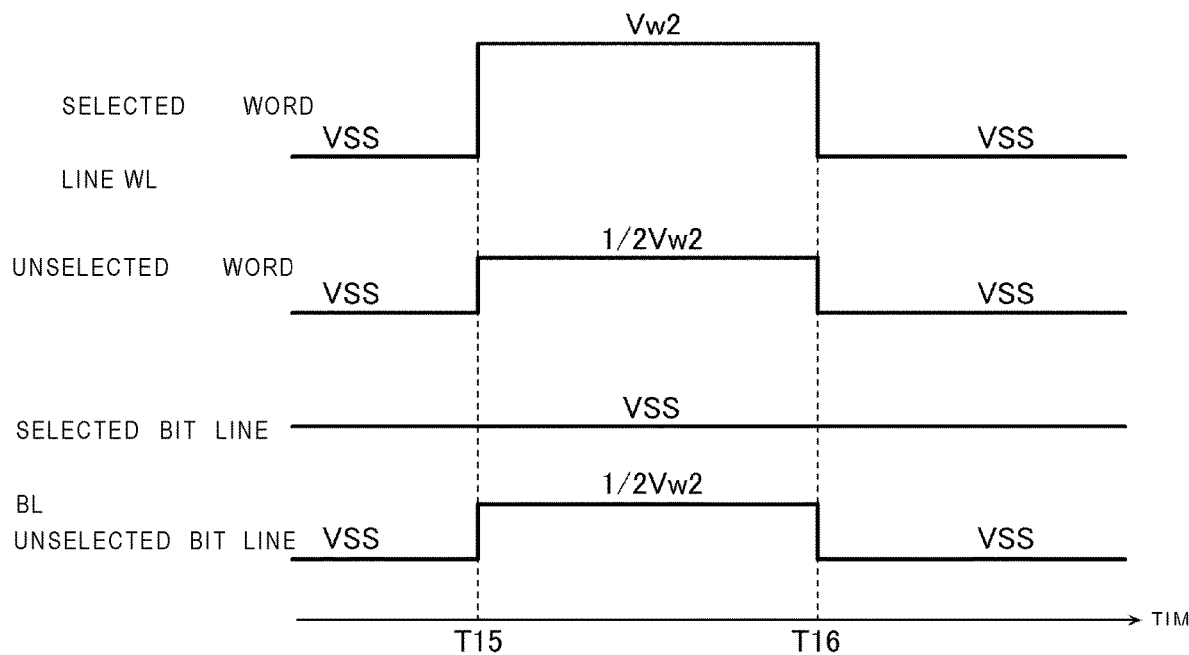
FIG. 16 is a timing chart illustrating a write operation according to the second embodiment.

Next, a semiconductor storage device according to a second embodiment will be described with reference to FIG. 15 and FIG. 16.

In the first embodiment, a unipolar type magnetic resistance element MR is illustrated as a resistance change element in the memory cell MC (FIG. 5). However, a bipolar type resistance change element may also be used as the resistance change element in the memory cell MC. For example, a magnetic resistance layer 25' illustrated in FIG. includes a magnetization fixed layer 41, a tunnel insulating layer 42, and a magnetization free layer 43.

The magnetization fixed layer 41 is a conductive layer of a ferromagnetic material. The magnetization fixed layer 41 has a magnetization easy axis direction perpendicular to the film surface (Z direction). In the illustrated example, the magnetization direction of the magnetization fixed layer 41 is the downward direction. The magnetization fixed layer 41 may contain, for example, an element or the like which can be used for the first magnetization fixed layer 34 (FIG. 5).

The tunnel insulating layer 42 is an insulating layer of a nonmagnetic material. The tunnel insulating layer 42 may contain, for example, magnesium oxide (MgO), and may also contain other elements.

The magnetization free layer 43 is a conductive layer of a ferromagnetic material. The magnetization free layer 43 has a magnetization easy axis direction perpendicular to the film surface (Z direction). The magnetization free layer 43 may contain, for example, an element or the like which can be used for the magnetization free layer 32.

[Operation]

Next, the operation of the semiconductor storage device according to the present embodiment will be described.

[Write Operation]

First, a write operation of changing the memory cell MC from a high-resistance state to a low-resistance state will be described with reference to FIG. 16 or the like. FIG. 16 is a schematic timing chart showing the voltages of the word line WL and the bit line BL in the write operation.

In the write operation, for example, from a timing T15 to a timing T16, the voltage of the selected bit line BL is set to a voltage VSS, the voltage of the selected word line WL is set to a voltage Vw2 (>VSS), and the voltages of the unselected word line WL and the unselected bit line BL are set to a voltage ½Vw2.

When the voltage Vw0 is applied to the selected memory cell MC connected to the selected bit line BL and the selected word line WL, the nonlinear layer 23 (FIG. 4) is brought into an on state, and the current flows from the selected word line WL to the selected bit line BL.

Accordingly, a spin torque corresponding to the magnetization direction (downward direction) of the magnetization fixed layer 41 is injected into the magnetization free layer 43. Accordingly, the magnetization direction of the magnetization free layer 43 becomes parallel to the magnetization direction of the magnetization fixed layer 41.

[Erase Operation]

Next, an erase operation of changing the memory cell MC from a low-resistance state to a high-resistance state will be described.

In the erase operation, for example, the voltages of the word lines WL and the bit lines BL are set in a manner described with reference to FIG. 7. Accordingly, the current flows from the selected bit line BL to the selected word line WL.

Here, electrons supplied from the word line WL to the magnetization free layer 43 are spin-polarized in the magnetization free layer 43. Among the spin-polarized electrons, electrons polarized in a direction same as the magnetization fixed layer 41 (downward direction) are injected into the magnetization fixed layer 41 via the tunnel insulating layer 42. On the other hand, electrons polarized in a direction opposite to the magnetization fixed layer 41 (upward direction) are reflected at an interface between the tunnel insulating layer 42 and the magnetization fixed layer 41, and remain in the magnetization free layer 43. By using such a spin torque of the electrons, the magnetization direction of the magnetization free layer 43 becomes antiparallel to the magnetization direction of the magnetization fixed layer 41.

OTHER EMBODIMENTS

In the first embodiment and the second embodiment, the magnetic resistance element MR is illustrated as a resistance change element in the memory cell MC (FIG. 2 to FIG. 5). However, other elements may also be used as the resistance change element in the memory cell MC. For example, the resistance change element may be an element of a phase change memory (PCM) which contains GeSbTe or other chalcogen or chalcogenide and which can change between an amorphous state and a crystalline state. In addition, the resistance change element may be an element which includes an insulating layer of a metal oxide or the like and which can generate a filament such as a metal ion or an oxygen defect in the insulating layer.

In addition, in the first embodiment, the nonlinear layer 23 (FIG. 4) is illustrated as the nonlinear element NO in the memory cell MC. The nonlinear layer 23 may have a large variation in voltage (voltage $V_{th}$ in FIG. 10) at a low-resistance state, and may be in good compatibility with the read method according to the first embodiment. However, other elements may also be used as the nonlinear element NO in the memory cell MC. For example, the nonlinear element NO may be a PN junction diode. Further, the nonlinear element NO may be a MIM (Metal-Insulator-Metal) junction or a SIM (Semiconductor-Insulator-Metal) junction including two electrodes with different work functions and an insulating film provided between the two electrodes. In addition, the non linear element may include an insulating layer of a metal oxide or the like and which can generate a filament such as a metal ion or an oxygen defect in the insulating layer. Furthermore, the non linear element may include niobium oxide, vanadium oxide or alike.

Figure 17:
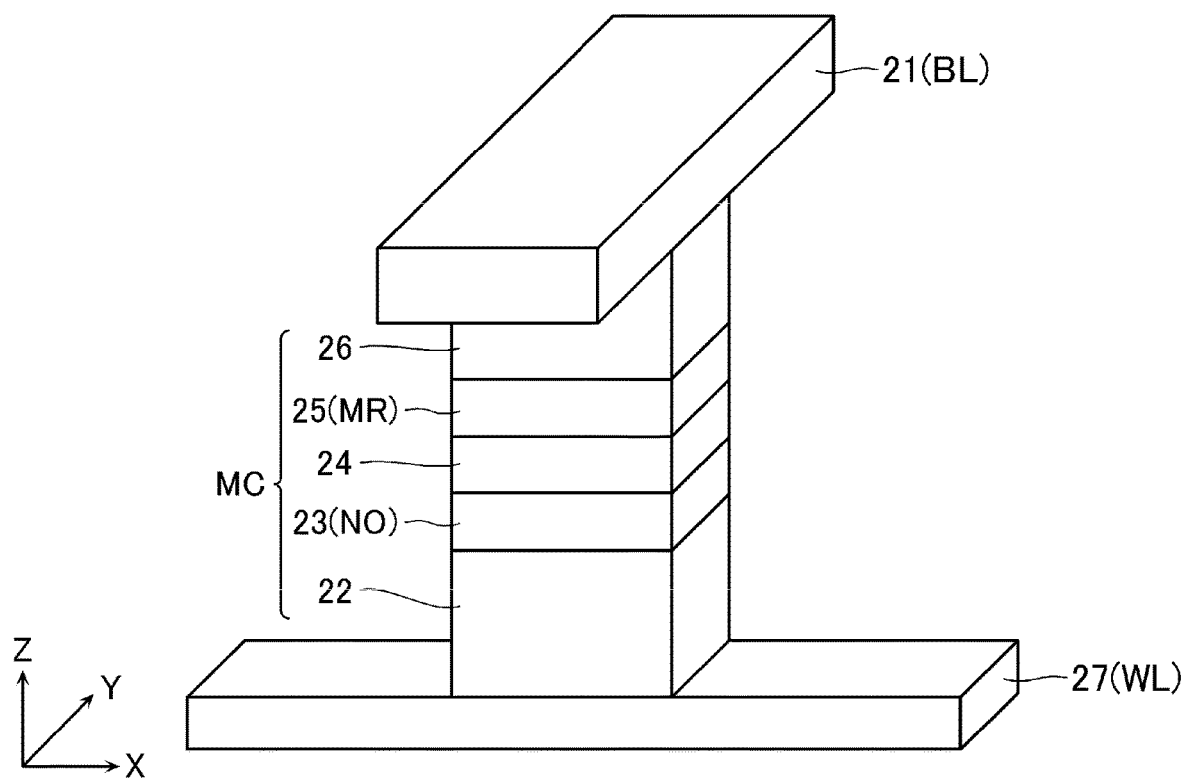
FIG. 17 is a schematic perspective view of a memory cell according to a modification.

In addition, a memory cell array including a layer of the bit line BL, a layer of the word line WL, and a layer of the memory cell MC is illustrated as the memory cell array 11 in the first embodiment. However, the memory cell array 11 may also include a plurality of layers of the memory cells MC. In such a case, for example, in the layer of the memory cell MC adjacent in the Z direction, the positional relationship of the bit line BL and the word line WL may be reversed as illustrated in FIG. 4 and FIG. 17. In addition, at least one of the bit line BL and the word line WL may be connected to two memory cells MC adjacent in the Z direction.

Figure 18:
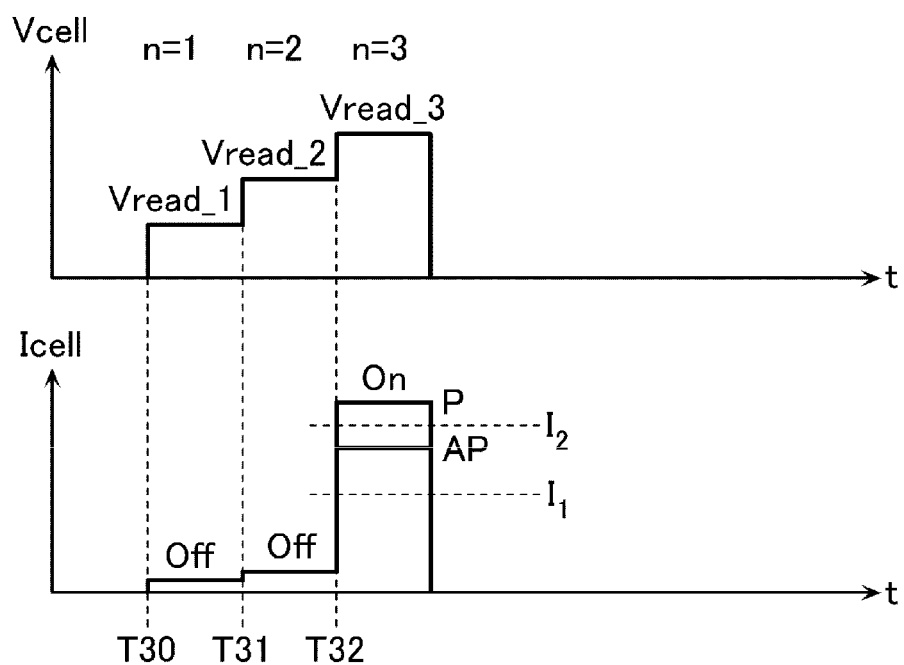
FIG. 18 is a timing chart illustrating a read operation according to a modification.

In addition, in the first embodiment, as illustrated in FIG. 14, the cell voltage Vcell returns to the voltage VSS one by one after the cell voltage Vcell is set to the voltage Vread_n. That is, a gap is provided between a pulse corresponding to the voltage Vread_n and a pulse corresponding to the voltage Vread_n+1. However, for example, as illustrated in FIG. 18, the cell voltage Vcell may not return to the voltage VSS, and the cell voltage Vcell may be directly increased from Vread_K (K is an integer of 1 or more and N−1 or less) to Vread_K+1. That is, the pulse corresponding to the voltage Vread_n and the pulse corresponding to the voltage Vread_n+1 may be continuously output.

In addition, in the examples of FIG. 14 and FIG. 18, after the cell voltage Vcell is set to Vread_K, the cell voltage Vcell is maintained at Vread_K for a predetermined period of time, and the current or the voltage is detected by the sense amplifier circuit or the like in the state. However, for example, as illustrated in FIG. 19, the cell voltage Vcell may be continuously increased from Vread_K to Vread_K+1.

Figure 19:
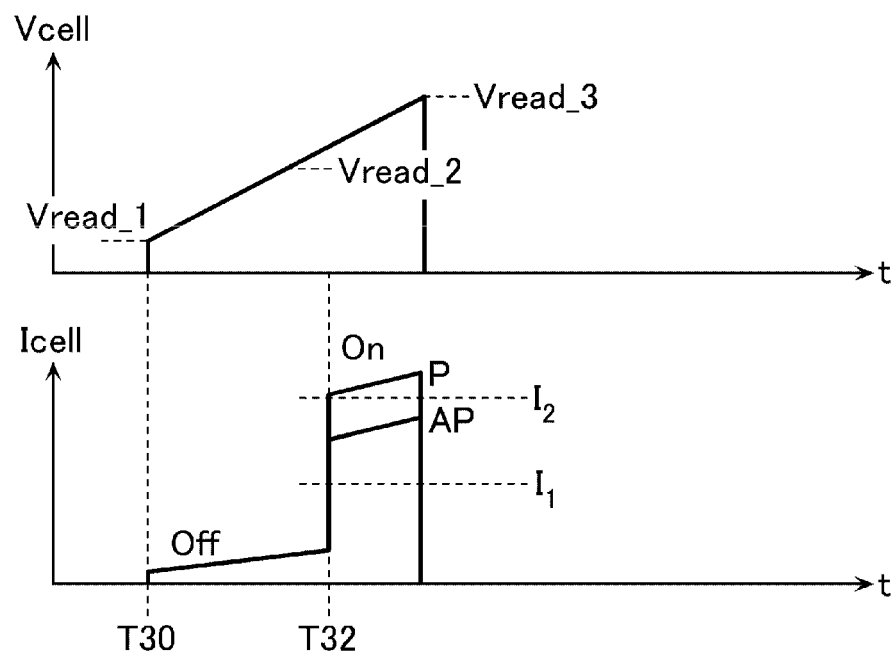
FIG. 19 is a timing chart illustrating the read operation according to a modification.
Figure 20:
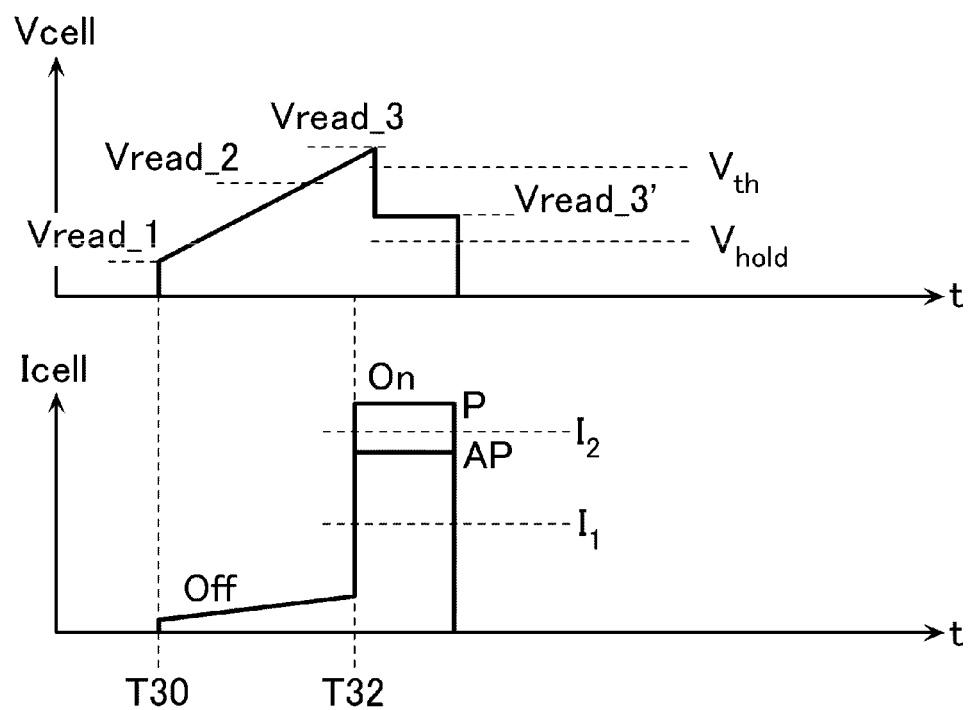
FIG. 20 is a timing chart illustrating the read operation according to a modification.

In addition, in the example of FIG. 19, after the cell current Icell becomes larger than the current $I_1$, the cell voltage Vcell continues to increase for a predetermined period of time. However, when the cell voltage Vcell reaches the voltage $V_{th}$ of FIG. 10, the nonlinear layer 23 is brought into an on state, and the on state is maintained as long as the cell voltage Vcell does not fall below the voltage $V_{hold}$ of FIG. 10. Therefore, for example, as illustrated in FIG. 20, when the cell current Icell exceeds $I_1$, the cell voltage Vcell is reduced to a predetermined voltage Vread_3' and is maintained for a predetermined period of time, and in this state, whether the cell current Icell is equal to or larger than $I_2$ may be determined. Accordingly, the stress applied to the memory cell MC may be reduced. The voltage Vread_3' is set to be equal to or larger than the voltage $V_{hold}$ and equal to or smaller than the voltage $V_{th}$, for example.

FIG. 20 shows an example in which the cell voltage Vcell is continuously increased from Vread_K to Vread_K+1, which is similar to FIG. 19. However, in the method similar to the method described with reference to FIG. 14 or FIG. 18, similar to FIG. 20, when the cell current Icell exceeds $I_1$, the cell voltage Vcell is reduced to a predetermined voltage Vread_3' and is maintained for a predetermined period of time, and in this state, whether the cell current Icell is equal to or larger than $I_2$ may be determined.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a first wiring;
   a first resistance change element connected to the first wiring;
   a first nonlinear element connected to the first resistance change element; and
   a second wiring connected to the first nonlinear element, wherein
   the semiconductor storage device is configured such that in a read operation for the first resistance change element,
   a voltage, applied to the semiconductor storage device through the first wiring and the second wiring, is increased to a first voltage determined based on a histogram of read threshold voltages of a plurality of memory cells in the semiconductor storage device, and
   after the voltage applied through the first wiring and the second wiring is increased to the first voltage, the voltage applied through the first wiring and the second wiring is increased to a second voltage which is greater than the first voltage and determined based on the histogram.

2. The semiconductor storage device according to claim 1, further comprising:
   a third wiring;
   a second resistance change element connected to the third wiring;
   a second nonlinear element connected to the second resistance change element; and
   a fourth wiring connected to the second nonlinear element, wherein
   the semiconductor storage device is configured such that in a read operation for the second resistance change element,
   a voltage, applied to the semiconductor storage device through the third wiring and the fourth wiring, is increased to the first voltage, and
   after the voltage applied through the third wiring and the fourth wiring is increased to the first voltage, the voltage applied through the third wiring and the fourth wiring is maintained at a voltage less than the second voltage.

3. The semiconductor storage device according to claim 1, wherein the voltage applied through the first wiring and the second wiring is increased to the second voltage if a current flowing through the first nonlinear element is less than a current threshold.

4. The semiconductor storage device according to claim 3, wherein the current threshold is predetermined to be larger than the current flowing through the first nonlinear element at the threshold voltage.

5. The semiconductor storage device according to claim 2, wherein
each of the first and second resistance change elements includes a magnetic resistance element.

6. The semiconductor storage device according to claim 2, wherein
each of the first and second nonlinear elements contains a chalcogen.

7. The semiconductor storage device according to claim 2, wherein
each of the first and second nonlinear elements includes a metal layer containing at least one of silver (Ag) and copper (Cu), or an insulating layer.

8. A semiconductor storage device, comprising:

a first wiring;

a first resistance change element connected to the first wiring;

a first nonlinear element connected to the first resistance change element;

a second wiring connected to the first nonlinear element; and a peripheral circuit connected to the first wiring and the second wiring, wherein in a read operation for the first resistance change element, the peripheral circuit is configured to:

increase a voltage applied through the first wiring and the second wiring until a current flowing through the first resistance change element is greater than a first current, where the voltage is determined according to a histogram of read threshold voltages of a plurality of memory cells in the semiconductor storage device.

9. The semiconductor storage device according to claim 8, wherein
the first resistance change element includes a magnetic resistance element.

10. The semiconductor storage device according to claim 8, wherein
the first nonlinear element contains a chalcogen.

11. The semiconductor storage device according to claim 8, wherein
the first nonlinear element includes a metal layer containing at least one of silver (Ag) and copper (Cu), and an insulating layer.

12. The semiconductor storage device according to claim 8, wherein the peripheral circuit is further configured to:

output a first signal if the current flowing through the first resistance change element is greater than the first current and less than a second current, and output a second signal if the current flowing through the first resistance change element is greater than the first current and the second current.

13. A method comprising:

selecting a first voltage according to a histogram of read threshold voltages of a plurality of memory cells, each memory cell including a resistance change element and nonlinear element coupled to each other;

applying the first voltage on one of the plurality of memory cells;

comparing a current flowing through the memory cell with a first current threshold;

selectively increasing the first voltage to an amplitude determined according to the histogram until the current reaches the first current threshold; and outputting a state of data stored in the memory cell based on the comparison of the current with a second current threshold.

* * * * *